(12) United States Patent
Huska et al.

(10) Patent No.: US 9,502,625 B2
(45) Date of Patent: Nov. 22, 2016

(54) ELECTROPHOTOGRAPHIC DEPOSITION OF UNPACKAGED SEMICONDUCTOR DEVICE

(71) Applicant: Rohinni, LLC, Coeur d'Alene, ID (US)

(72) Inventors: Andrew Huska, Liberty Lake, WA (US); Cody Peterson, Hayden, ID (US); Kasey Christie, Austin, TX (US); Clint Adams, Coeur d'Alene, ID (US); Orin Ozias, Austin, TX (US)

(73) Assignee: Rohinni, LLC, Coeur d'Alene (ID)

( * ) Notice: Subject to any disclaimer, the term of this patent is extended or adjusted under 35 U.S.C. 154(b) by 0 days.

(21) Appl. No.: 14/729,745

(22) Filed: Jun. 3, 2015

(65) Prior Publication Data

US 2015/0357526 A1  Dec. 10, 2015

Related U.S. Application Data

(60) Provisional application No. 62/009,094, filed on Jun. 6, 2014.

(51) Int. Cl.
*G03G 15/04* (2006.01)
*H01L 33/56* (2010.01)

(52) U.S. Cl.
CPC ....... *H01L 33/56* (2013.01); *H01L 2933/0033* (2013.01)

(58) Field of Classification Search
CPC .................. G03G 15/04036; G03B 27/542
USPC ............. 438/3; 257/213, 690; 399/220, 227
See application file for complete search history.

(56) References Cited

U.S. PATENT DOCUMENTS

| | | | | |
|---|---|---|---|---|
| 2004/0197487 A1* | 10/2004 | Aoki | ...................... | G03G 5/056 427/458 |
| 2005/0227161 A1* | 10/2005 | Aoki | .................... | H05K 3/1266 430/125.1 |
| 2006/0172219 A1* | 8/2006 | Stasiak | ................ | G03G 15/221 430/118.6 |
| 2009/0263162 A1* | 10/2009 | Sharma | ................... | H04L 45/00 399/237 |
| 2009/0294803 A1* | 12/2009 | Nuzzo | .................... | B82Y 10/00 257/213 |
| 2010/0155923 A1* | 6/2010 | Poonjolai | ............ | H01L 21/6835 257/690 |

OTHER PUBLICATIONS

WIPO Publication WO 2015188172.*

* cited by examiner

*Primary Examiner* — Jami M Valentine

(74) *Attorney, Agent, or Firm* — Lee & Hayes, PLLC

(57) ABSTRACT

Described herein are techniques related a precision deposition of unpackaged semiconductor devices ("dies") onto a substrate. This Abstract is submitted with the understanding that it will not be used to interpret or limit the scope or meaning of the claims.

20 Claims, 6 Drawing Sheets

ELECTROPHOTOGRAPHIC DEPOSITION OF UNPACKAGED SEMICONDUCTOR DEVICE

PRIORITY CLAIM AND CROSS-REFERENCE TO RELATED APPLICATIONS

This application claims the benefit under 35 U.S.C. §119 (e)(1) of U.S. Provisional Application No. 62/009,094, filed Jun. 6, 2014, which is hereby incorporated by reference in its entirety.

BACKGROUND

Semiconductor devices are electrical components that utilize semiconductor material (such as silicon, germanium, gallium arsenide, and the like). Semiconductor devices are typically manufactured as single discrete devices or as integrated circuits (ICs). Examples of single discrete devices include light-emitting diodes (LEDs), diodes, transistors, resistors, and the like.

The fabrication of semiconductor devices typically involves an intricate manufacturing process with a myriad steps. The end-product of the fabrication is packaged semiconductor devices. A "packaged" modifier refers to the enclosure and protective features built into the final product as well as the interface that enables the device in the package to be incorporated into an ultimate circuit.

The conventional fabrication process for semiconductor devices starts with a semiconductor wafer. The wafer is diced into a multitude of unpackaged semiconductor devices. Herein, unpackaged semiconductor devices may be called semiconductor device dies. Indeed, the actions between the wafer handling and the packaging can be called "die preparation." After such preparation, the conventional fabrication process packages each of the dies.

Typically, the packaging involves mounting a die into a plastic or ceramic package (e.g., mold or enclosure). The packaging also includes connecting the die pads to pins/wires for interfacing/interconnecting with ultimate circuitry. The packaging of the semiconductor device is typically completed by sealing the die to protect it from the environment (e.g., dust, temperature, and/or moisture).

A product manufacturer includes the packaged semiconductor devices in the circuitry of their product. Because of their packaging, the devices are ready to be "plugged in" to the circuitry assembly of the product that the manufacturing is making. Because of their packaging, the devices are protecting from the elements that might degrade or destroy the device. In addition, because of their packaging, the devices are inherently larger (e.g., typically 2-3 times) than the die found inside the package. Thus, the resulting circuit assembly cannot be any thinner than the packaging of the semiconductor devices.

BRIEF DESCRIPTION OF THE DRAWINGS

The Detailed Description references the accompanying figures. In the figures, the left-most digit(s) of a reference number identifies the figure in which the reference number first appears. The same numbers are used throughout the drawings to reference like features and components.

DETAILED DESCRIPTION

Disclosed herein is a deposition of unpackaged semiconductor devices onto a substrate. Herein, such devices may be called "semiconductor device dies" or more simply "dies." Example implementations described herein include those where the unpackaged semiconductor devices include light emitting devices (LED). In the described examples, the LED dies are disposed onto a substrate using techniques similar to those involving printing ink or toner onto paper like those of electrophotographic printing techniques.

As described herein, the fabricated dies are manufactured to be ferromagnetic. A permanent iron magnet has ferromagnetic properties. However, not all ferromagnetic material includes iron. Indeed, ferromagnetism describes a property and behavior of material. In general, a ferromagnetic material is responsive to a magnetic field.

Herein, the dies described herein may be called "ferromagnetic" or magnetic-field responsive (MFR). When exposed to an electro-magnetic (EM) field, the ferromagnetic die moves or orients itself to align with the magnetic field. This aligns and orients the deposited dies so that it electrical contacts are positioned in a functional manner. An electro-magnetic (EM) polarization may provide the orienting magnetic field. Such an EM polarization, for example, may be implemented in techniques akin to electrophotographic printing techniques.

For the electrophotographic printing techniques, a latent image of a pre-configured outline of die placements (i.e., pre-configured circuitry layout design) is first written in a photosensitive drum component of an electrophotographic deposition. A developing unit component of the electrophotographic deposition is then filled with ferromagnetic dies, which are to be aligned and subsequently transferred to the photosensitive drum component. The alignment, for example, includes an application of the EM potential where the ferromagnetic dies are mobilized to form the pre-configured outline of die placements written as the latent image in the photosensitive drum component. In this example, the EM polarization is utilized to control horizontal and/or vertical (X and/or Y) orientations, direction, angular position, and distribution of the dies based from the written latent image.

Thereafter, the aligned dies are transferred from the developing unit component to the photosensitive drum component. Another alignment may be implemented in the photosensitive drum component as may be necessary and after which, a precision deposition of the aligned ferromagnetic dies is performed onto the substrate.

Figure 1:
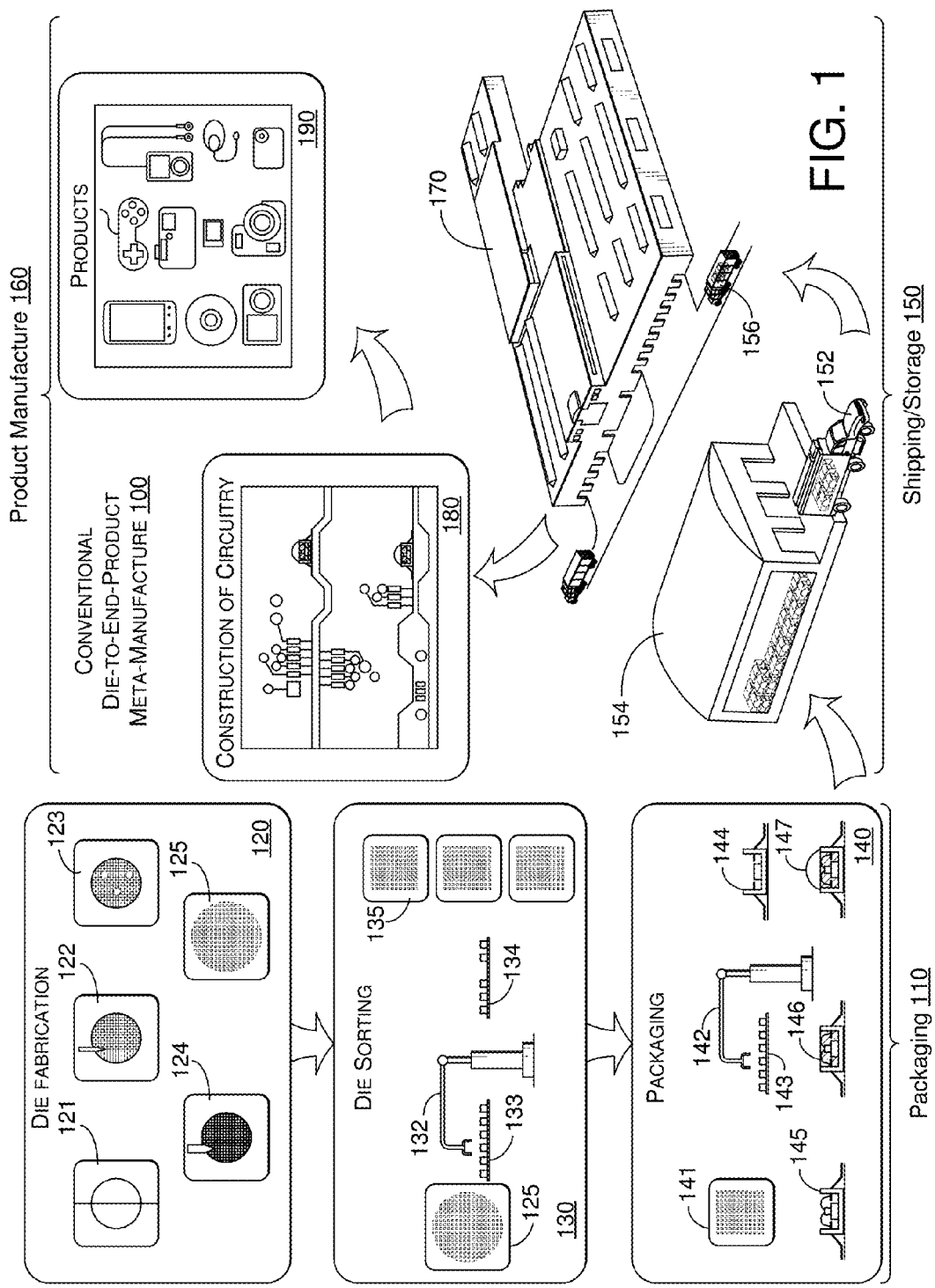
FIG. 1 is a background view illustrating a conventional die-to-end product manufacture.

The techniques described herein enable micro-precise deposition of the dies onto a substrate. Herein, micro-precise placement or deposition involves the die being placed within fifteen (15) microns (+/−15 microns) of the intended target.
Typical Die-to-End-Product Meta-Manufacturing FIG. 1 illustrates a conventional die-to-end-product meta-manufacture 100. The meta-manufacture usually includes three parts: semiconductor-device-package manufacture 110, shipping/storage 150, and product manufacture 160.

The semiconductor-device-package manufacture 110 includes die fabrication 120, die sorting 130, and die packaging 140.

Before the die fabrication 120 starts, a wafer manufacturer supplies a semiconductor wafer. A typical wafer is sliced from ingots of silicon or other semiconductor material. Each wafer includes many (e.g., hundreds, thousands, or millions) of semiconductor devices. Semiconductor devices are typically manufactured as single discrete devices or as integrated circuits (ICs). Examples of single-discrete devices include light-emitting diodes (LEDs), diodes, transistors, resistors, and the like. For illustration purpose, the LED is a concrete example of a semiconductor device discussed herein. More particularly, the LED is the concrete example of a single-discrete semiconductor device discussed herein.

The die fabrication 120 includes wafer mounting 121, wafer etching 122, die testing 123, wafer dicing 124, and wafer stretching 125. The die fabrication is sometimes called die preparation. Those of ordinary skill in the art view conventional die preparation as the step in the semiconductor device fabrication in which a wafer is prepared for packaging and/or testing.

During wafer mounting 121, the wafer is mounted on a stretchy low-tack adhesive tape that is itself attached to a ring. This tape may is generally called "dicing tape" or more commonly "blue tape," since it traditionally has a blue hue. Since the dicing tape holds or carries the wafer (and ultimately the dies) it is often generically called carrier tape or more simply as the carrier.

The dicing tape is often made from flexible and stretch material (such as polyvinyl chloride (PVC)) and has an adhesive (e.g., acrylic or synthetic acrylic) bonded one side. The dicing type typically has a high tear strength, is flexible, and stretchy. Generally, one of the main purposes of the dicing tape is to ensure that the individual dies remain firmly in place during dicing 124 of the wafer into separate dies.

After the wafer is mounted, the wafer is etched 122 and diced 124. The wafer etching may also be called scoring. The wafer dicing may be called semiconductor-die cutting. Sometimes the combination of etching/dicing is called die singulation.

During the die singulation (e.g., etching 122 and dicing 124), the wafer is cut into rectangular pieces, each called a die. In between those functional parts of the circuits of the wafer, a thin non-functional spacing is foreseen where a saw (or the like) can safely cut the wafer without damaging the circuits of the semi-conductor devices in the wafer. Usually the dicing is performed with a water-cooled circular saw with diamond-tipped teeth.

During the testing 123, each semiconductor device is subjected to various testing. From this testing, various properties of each device is determined and tracked. That is, a database or map of the devices of the wafer is created that records the determined properties of each device. Herein, this may be called "device map," "die database," or the like. As depicted in FIG. 1, the testing 123 is shown as occurring between the etching 122 and the dicing 124. In other instances, the testing can occur at other points during the die fabrication 120.

Typically, the testing 123 involves testing the dies on the wafer with an electronics tester that pressing tiny probes against the die. The testing often involves determining the electrical functioning of the circuitry of the die. For example, when a LED die is tested, its luminance properties are tracked. Such luminance properties may include brightness, color, and the like.

After the die singulation, the wafer is typically stretched 125. This is also called wafer expansion. The dicing tape on which the wafer is adheared is stretched out radially to increase the spacing between the now physically separated dies of the wafer. The typical reason for doing this is to prevent die edge damage during shipping or during the conventional pick-and-place operation.

In many instances, the die sorting 130 occurs next after the die fabrication. This may be called die binning. The purpose of the die sorting is to collect like dies together in "bins." The dies are sorted based upon their properties as determined during the testing 123.

The die sorting 130 starts with the stretched wafer 125, which was the result of the die fabrication 120. A pick-and-place machine 132 picks up individual dies from the stretch wafer. As depicted, stretched wafer 133 is a side elevation view of the same stretched wafer 125. Stretched wafer 134 shows the same wafer 133 after one die has been removed. The pick-and-place machine 132 places the dies into one or many "bins" 135 (or binned carriers). The bins are often a matrix of dies on dicing tape. Each bin contains like or similar dies based upon one or more properties.

The pick-and-place machine 132 is the kind of machine commonly used by fabricators of semiconductor devices (e.g., LEDs) to transfer their devices from one location to another. In particular, such machines are used to pick a single-discrete device (e.g., LED) from one carrier tape to another. As shown, with the die sorting 130, the pick-and-place machine 132 picks a die off of the original carrier 133/134 and places onto one of multiple binned carriers 135.

The packaging 140 stage starts with one of the binned carriers (shown as carrier 141) of like dies. A pick-and-place machine 142 is shown picking a die from a side elevation view of the carrier 143 and placing it into a package mold 144. This is often called mounting. The packaging mold 144 is often made of plastic or ceramic. At 145, wires are added to connect the electrical contacts of the die to the packaging's external contacts. At 146, the mold is filled with an environmentally protecting sealant. Often, the die is capped as is shown at 147. If the die is an LED then often this cap is a lens to focus and direct the light.

Wikipedia.com describes a semiconductor package in this manner:

A semiconductor package may have as few as two leads or contacts for devices such as diodes, or in the case of advanced microprocessors, a package may have hundreds of connections. Very small packages may be supported only by their wire leads. ///

In addition to providing connections to the semiconductor and handling waste heat, the semiconductor package must protect the "chip" from the environment, particularly the ingress of moisture. Stray particles or corrosion products inside the package may degrade performance of the device or cause failure. A hermetic package allows essentially no gas exchange with the surroundings; such construction requires glass, ceramic or metal enclosures.

As represented by packaged device 147, the packaged semiconductor device (e.g., an LED) is the sellable product that is the result of the semiconductor-device-package manufacture 110.

The shipping/storage 150 part includes a warehouse 152 and shipping 154, 156 to/from that warehouse. Typically, the packaged devices are purchased by commercial enterprises, especially device/product manufactures. Until such purchase, the packaged devices are stored. The shipping/storage 150 part represents the typical scenario where the manufacturer of the packaged devices ships 152 their goods to a warehouse 154 for storage while awaiting orders or as part of a distribution system. From the warehouse 154, the purchased packaged devices are delivered 156 to a product manufacturer 170, for example. Sometimes the shipment/delivery (152/156) may be across a nation or an ocean. That adds time and cost to the overall die-to-end-product meta-manufacture 100.

The product manufacture 160 part includes the product manufacturer 170 itself, construction 180 of the circuitry that will go into an electronic product, and manufactured products 190.

The product manufacturer 170 is a company that creates and/or sells an electronic device or product or some portion thereof. For example, the product manufacturer 170 may be an original equipment manufacturer (OEM). An OEM is a company that makes a part or subsystem that is used in another company's end-product. Regardless, the final product that is being built has some electronic circuitry included therein.

At 180, that electronic circuitry is constructed. Such construction typically includes, for example, placing electronic components (e.g., transistors, diodes, ICs, batteries, resistors, capacitors, and the like) on a printed circuit board (PCB) and electronically linking such components using wires or other conduct tracks. Indeed, PCBs typically have conductive layers and non-conductive layers. The PCB offers mechanical support and insulation for the electronic components and their conductive links.

The packaged devices (such as device 147) is an example of the type of electronic component that is used in the construction of electronic circuitry at 180. Since the packaged device is already protected from environmental elements, the constructed circuitry does not necessarily needs environmental protection.

One or more of the completed circuitry is assembled together with other mechanical and functional parts to form an intermediate sub-system or the end-product itself. Regardless, at some point in the overall product manufacturing process, the end-product is finally assembled and is ready to be distributed to customers and/or retail outlets. The end-product may be most any device with electronic circuitry therein. Examples of such end-products includes mobile phones, game controllers, digital music players, digital cameras, toys, video game consoles, computer input devices, medical devices, televisions, computers, appliances, automobiles, ebook readers, and the like.

Exemplary Tool

Figure 2:
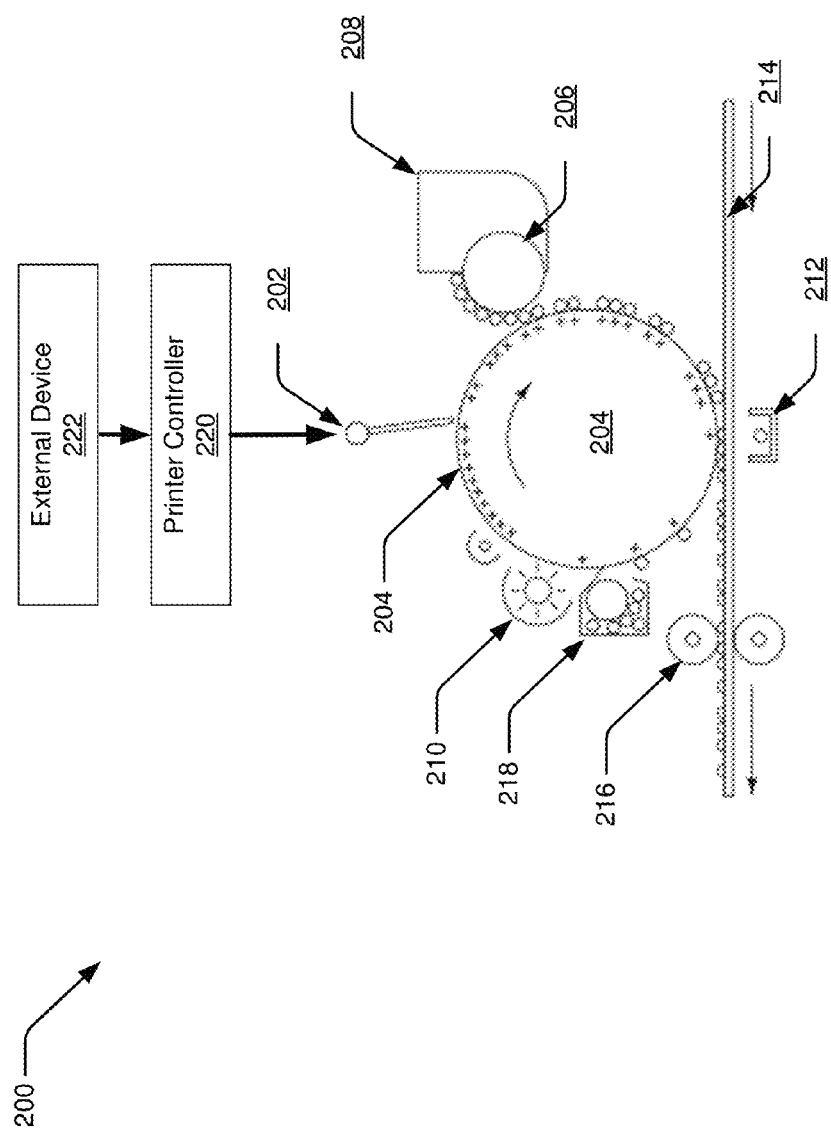
FIG. 2 is an example cross-sectional view of an electrophotographic deposition for deposition of ferromagnetic semiconductor device dies on a substrate as described in present implementations herein.

FIG. 2 illustrates an example cross-sectional view of an electrophotographic die depositor 200 for precision deposition of semiconductor device dies onto a substrate. The semiconductor device dies, for example, includes the unpackaged singulated dies as described in FIG. 1 above. In this example, the electrophotographic die depositor 200 is configured to facilitate formation or deposition of dies or unpackaged dies onto the substrate.

Typical electrophotographic printing is a printing technique used in laser and light-emitting diode (LED) printers and most copy machines. It uses electrostatic charges, dry ink (i.e., toner) and light. A selenium-coated, photoconductive drum is positively charged. Using a laser or an array of LEDs, a negative of the to-be-printed image is beamed onto the drum, cancelling the charge and leaving a positively charged replica of the original to-be-printed image. Then, the negatively charged toner is attracted to the positive image on the drum, and the toner is then attracted to the paper, also positively charged. With typical electrophotographic printing, the final stage is fusing, which uses heat and pressure, pressure alone or light to cause the toner to permanently adhere to the paper.

The electrophotographic die depositor 200 described herein deposits unpackaged semiconductor devices (i.e., dies) onto a substrate using some approaches akin to conventional electrophotographic deposition that prints toner onto paper.

As shown here, the electrophotographic die depositor 200 may include a light-emission subsystem 202, a photosensitive drum 204, a developing unit 206 that is coupled to an EM potential supply 208, a charging unit 210, a transfer charger 212, a substrate 214, a guiding roller 216, and a cleaning sheet 218. The electrophotographic die depositor 200 further includes a printer controller 220 that may be coupled to an external device 222 such as one or more computers, portable computing devices, substrate handling mechanics, or the like.

The light-emission subsystem 202 may be implemented by any suitable light emission mechanism. For example, the light-emission subsystem 202 may be a laser or an array of light-emitting diodes (LEDs). For this example, the light-emission subsystem may be called the laser 202.

As described herein, the external device 222 may be utilized as a source of a specified circuitry layout design or the pre-configured outline of die placements on the substrate 214. For example, the specified circuitry layout design may be based upon previously formed layers or materials on the substrate 214, which may still be at early manufacturing stage prior to the deposition process as described herein. In this example, the specified circuitry layout design may include what area(s), portion(s), etc. on the layer of the substrate 214 may need to be filled with the unpackaged semiconductor device dies (or simply dies).

In another example, the specified circuitry layout design may include more or less the number of dies that is required to fill the particular areas or portions on the layer of the substrate 214. The required number of semiconductor device dies, for example, may be based upon the shape and configuration of each die, which may be known or pre-determined prior to deposition process as described herein.

The printer controller 220 may receive the specified circuitry layout design from the external device 222 in the form of input code data, and converts the received input code data into an image data. The image data may be used to modulate the lasers 202, which form an emission pattern according to the image data and based upon a photosensitive surface of the photosensitive drum 204. After the light exposure of the photosensitive surface of the photosensitive drum 204, a latent image according to the emission pattern is formed on the photosensitive drum 204. The latent image, for example, may include an image representation of the pre-configured outline of die placements or the specified circuitry layout design of dies on the substrate 214.

The photosensitive drum 204 rotates in clockwise direction and is disposed inside a main body of the electrophotographic deposition 200. Around the photosensitive drum 204 is the charging unit 210, which facilitates uniform charging of the surface of the photosensitive drum 204, and the developing unit 206, which facilitates formation of a "toner" image by attaching dies to the photosensitive drum 204. The toner image, for example, corresponds to the latent image or the exposure pattern that was formed through emission of lights from the laser 202.

As described herein, the die used with this implementation is ferromagnetic. When exposed to an electro-magnetic (EM) field, the ferromagnetic die moves or orients itself to align with the magnetic field. This aligns and orients the deposited dies so that it electrical contacts are positioned in a functional manner. For example, the contacts align with where existing or expected conductive links (e.g., conductive traces or exposed conductive layers) will be or are.

An electro-magnetic (EM) polarization provides the orienting magnetic field. The ferromagnetism of the die facilitates position/orientation mobility of the ferromagnetic dies when exposed to the EM polarizations generated by the EM potential 208.

With the ferromagnetic die, the developing unit 206 is filled with a many of the discrete ferromagnetic dies that have uniform shapes. These uniform shapes and specific number (if known) of ferromagnetic dies may be used as computation variables in the specified circuitry layout design. In other words, at each sequence of die deposition onto the substrate 214, the number and shapes of ferromagnetic dies in the developing unit 206 are pre-configured to more or less complete the required number of ferromagnetic dies to be formed onto the substrate 214.

The developing unit 206 may be configured to align the ferromagnetic dies based from the pre-configured outline of die placements, which is similar to the formed latent image in the photosensitive drum 204. As described herein, the developing unit 206 receives different EM polarizations that are generated by the EM potential 208. The controlled application of EM polarizations, for example, are utilized to align and manipulate the orientation, angular position, symmetry, and the like, of each ferromagnetic die with respect to another ferromagnetic die. In this example, the controlled application of EM polarizations may correspond to certain attraction or repulsion of the dopant material formed on the ferromagnetic dies. Furthermore, after the controlled application of the EM polarization, the developing unit 206 may be configured to detect substantial alignment of the ferromagnetic dies with the use of a sensor (not shown). The substantial alignment in this case is based from the specified circuitry layout design that was supplied by the external device 222.

After the alignment of the ferromagnetic dies in the developing unit 206, the aligned ferromagnetic dies are transferred and attached to the latent image formed on the photosensitive drum 204. The transfer of the aligned ferromagnetic dies may follow the exposure pattern based from the pre-configured outline of the ferromagnetic die placements in the substrate 214. Furthermore, the transfer of the aligned ferromagnetic dies may be implemented individually and at a certain frequency until the desired latent image is filled with ferromagnetic dies.

At the bottom of the photosensitive drum 204 is the transfer charger 212 that is configured to facilitate transfer of the attached ferromagnetic dies from the photosensitive drum 204 onto the substrate 214. For example, the substrate 214 passes between the photosensitive drum 204 and the transfer charger 212 during the actual deposition of the ferromagnetic dies from the photosensitive drum 204 onto the substrate 214. In this example, the transfer charger 212 is configured to provide the electrostatic charges in detaching the formed ferromagnetic die from the photosensitive drum 204 onto the substrate 214.

With continuing reference to FIG. 2, the cleaning means 218 may collect the ferromagnetic dies left behind on the photosensitive drum 204 after the deposition process for the present sequence. The movement of the substrate 214 is controlled by the guide roller 216 and another sequence of precision deposition of dies may be carried out as necessary until the specified circuitry layout design from the external device 222 is completed.

Exemplary Implementation

Figure 3:
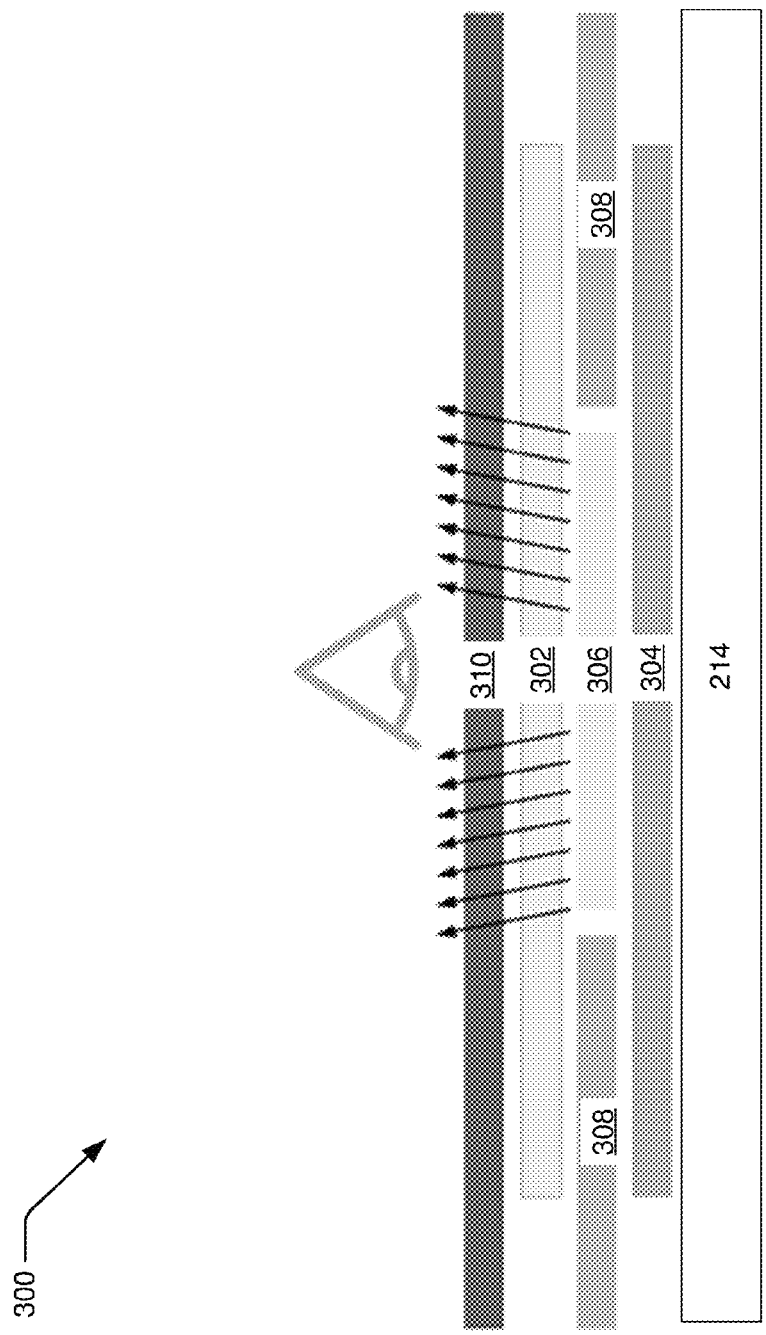
FIG. 3 is a cross-sectional view of an example discrete packaged semiconductor device (e.g., LED) as described in present implementations herein.

FIG. 3 is a cross-sectional view of an example discrete packaged LED 300 that is the formed, at least in part, from the techniques described herein.

As shown, the packaged LED 300 includes a top conductive layer 302 and a bottom conductive layer 304. Alternatively, these may be formed by conductive traces on either side of the die. As showed, sandwiched in between these conductive layers 302 and 304 is a middle layer that contains light-generating sources 306 (such as LEDs). In particular, the light-generating sources 306 includes the formed ferromagnetic dies that were printed by the electrophotographic die depositor 200 as described in FIG. 2 above.

The packaged LED 300 further shows a dielectric layer 308 surrounding the light-generating sources 306, and a translucent or transparent thin film 300 (e.g., polyester) or other coating that is positioned at the top most layer of the packaged LED 300. The dielectric layer 308, for example, is made of ceramic or plastic material to isolate the top conductive layer 302 from the bottom conductive layer 304. On the other hand, the transparent thin film 310 may direct light beams or reflection of the dies from the light-generating sources 306.

Going back to FIG. 2, the deposition of the ferromagnetic dies may be based upon the formed layers or materials on the substrate 214, which may still be at the early manufacturing stage prior to the deposition process as described herein. In relation to the packaged LED 300 in FIG. 3, the deposition process (i.e., of ferromagnetic dies) may be performed after the formation of at least the conductive layer 304 on top of the substrate 214.

For example, the conductive layer 304 is first patterned and formed on the substrate 214. In this example, the deposition process may be performed subsequently to form the light-generating sources 306. The deposition process, for example, is implemented through the electrophotographic printing technique as described in FIG. 2 above.

After the formation of the light-generating sources 306 onto the conductive layer 304, the dielectric layer 308, the conductive layer 302, and the translucent thin film 310 may be formed subsequently on the substrate 214. In other implementations, the deposition process may be implemented after the formation of the bottom conductive layer 304 and the dielectric layer 308 onto the substrate 214. In this other implementation, the pre-configured outline of die placements may include the number and shapes of ferromagnetic dies that are required to fill the desired circuitry layout in between the dielectric layer 308.

Figure 4:
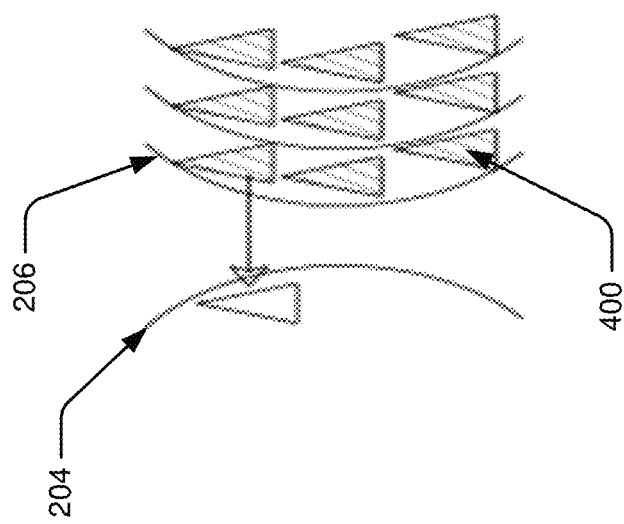
FIG. 4 is an example implementation for transferring ferromagnetic dies from a developing unit component to a photosensitive drum component in an exemplary electrophotographic deposition technique as described herein.

FIG. 4 is an example implementation for transferring ferromagnetic dies from the developing unit component to the photosensitive drum component in the exemplary electrophotographic deposition technique.

As shown here, uniformly shaped ferromagnetic dies 400 are disposed partially or wholly on outer perimeter of the die. For example, the dopant material is formed as a line across the width or length of the unpackaged die, formed as dots at each end of the unpackaged die, formed in an uneven manner across the unpackaged die, or the like. In this example, the controlled application the EM polarization, which exerts a corresponding pico-newton force onto the dopant material, may facilitate alignment of the ferromagnetic dies 400 based on the formation of the dopant material in the unpackaged die.

With the aligned ferromagnetic dies 400, each ferromagnetic die 400 is transferred individually to the photosensitive drum 204. The transfer, for example, may be implemented by controlling the electrostatic charge in the photosensitive drum 204 to attract the aligned ferromagnetic die 400 from the developing unit 206. Furthermore, the transfer of the ferromagnetic dies 400, which were aligned to correspond with the formed latent image in the photosensitive drum 204, may be implemented sequentially.

For example, the formed latent image at the photosensitive drum 204 may require different ferromagnetic die configurations such as colored ferromagnetic dies, low-beam ferromagnetic dies, or the like, for a particular area on the substrate 214. In this example, the deposition of differently configured ferromagnetic dies 400 may be implemented sequentially by separating the deposition process for each configuration. The first sequence, for example, includes a deposition of white colored ferromagnetic dies 400 onto a first area on the substrate 214. The second sequence, for example, includes deposition of shaded ferromagnetic dies 400 on another area of the substrate 214, and so on until the specified circuitry layout design in completed.

Although FIG. 4 illustrates a pre-alignment of all ferromagnetic die 400 for each sequence, individual alignment of each ferromagnetic die 400 may be implemented prior to transferring of the individual ferromagnetic die 400 to the photosensitive drum 204.

Figure 5:
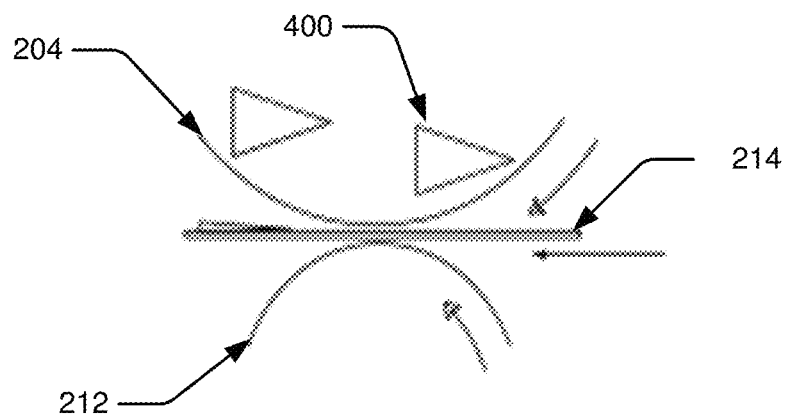
FIG. 5 is an example implementation of printing or performing semiconductor device dies deposition onto the substrate.

FIG. 5 illustrates an example implementation of printing or performing ferromagnetic die (e.g., die) deposition onto the substrate.

As shown here, the attached ferromagnetic dies 400 on the photosensitive drum 204 are transferred, printed, or deposited onto the substrate 214. In this scenario, the transfer charger 212 is configured to provide the electrostatic charges in detaching the formed ferromagnetic dies 400 from the photosensitive drum 204 onto the substrate 214 for each sequence of the deposition process. In other words, the substrate 214 may move backward or forward for each sequence of the deposition process until the desired specified circuitry layout design is completed.

Exemplary Process

Figure 6:
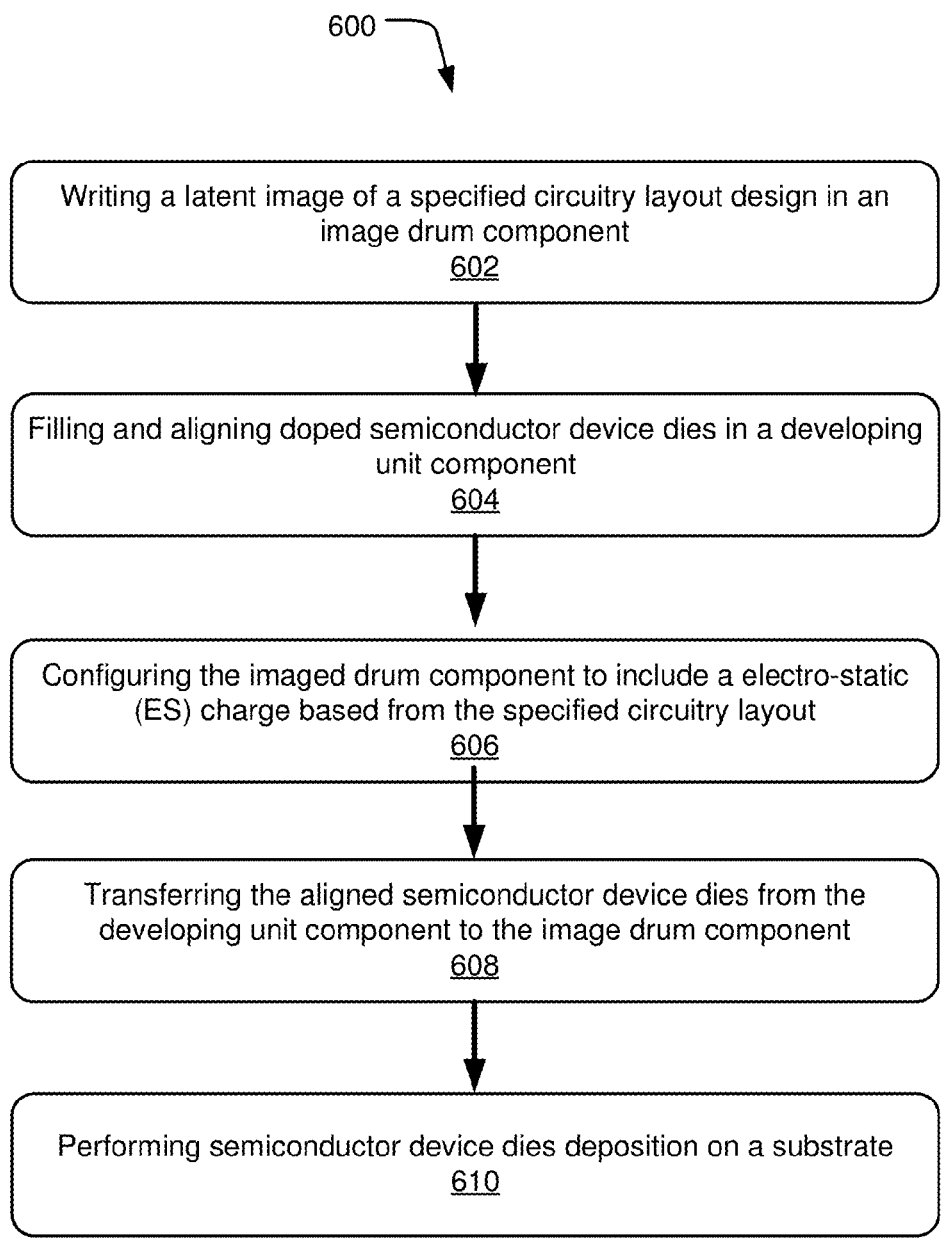
FIG. 6 is a flow diagram illustrating an example process chart for implementing, at least in part, the technology described herein.

FIG. 6 is a flow diagram illustrating an example process chart 600 for implementing, at least in part, the technology described herein. In particular, process 600 depicts a precision deposition of ferromagnetic dies using an electrophotographic printing technique.

At block 602, a latent image of a pre-configured outline of die placements is written to form a latent image in a photosensitive drum component. For example, the pre-configured outline of die placements includes a specified circuitry layout design of ferromagnetic dies that will be printed on a particular area or portions of the substrate. In this example, the substrate may include a formed layer such as the conductive layer 304 (FIG. 3) for a first terminal connection of the ferromagnetic dies.

At block 604, ferromagnetic dies are placed onto a developing unit component of the electrophotographic deposition. In the above example, specific number and shapes of ferromagnetic dies are positioned onto the developing unit based upon the deposition process sequence to be performed. For each sequence, the developing unit is configured facilitate alignment of the ferromagnetic dies through a controlled application of EM potential or polarizations.

At the developing unit component, the controlled application of the EM potential may align the orientation, direction, angular position, etc. of the ferromagnetic dies for the present deposition sequence to be performed. The alignment, for example, is based from the pre-configured outline of the semiconductor device dies placement.

At bock 606, the photosensitive drum component is configured to include electrostatic charges based on the specified circuitry layout of the semiconductor device dies. For example, the charging unit 210 may provide formation of electrostatic charges on the photosensitive drum 204. In this example, the electrostatic charges may further facilitate re-alignment of the ferromagnetic dies to overcome the effect of friction and air gap between the photosensitive drum 204 and the developing unit 206.

At block 608, the aligned ferromagnetic dies at the developing unit component are transferred to the photosensitive drum component. For example, the electrostatic charges at the photosensitive drum 204 are configured to attract the aligned ferromagnetic dies from the developing unit 206. In this example, the electrostatic charges may further minimize the effect of friction and air gap in between the photosensitive drum 204 and the developing unit 206.

At block 610, deposition of the aligned ferromagnetic dies is performed onto the substrate. For example, with the use of the electrophotographic deposition technique, deposition of the dies may be performed on the substrate by transferring or printing of the aligned ferromagnetic dies from the photosensitive drum component onto the substrate.

Additional and Alternative Implementation Notes

The dies described herein may be LEDs. More particularly, they may be microLEDs. MicroLEDs are 5-100 microns in diameter. Some implementations described herein use LEDs with a diameter of 15-50 microns. Still other implementations use LEDs having a diameter of 20-30 microns.

As used herein, semiconductor device refers to both single discrete devices or as integrated circuits (ICs). As used herein, a reference to a single-discrete semiconductor device ("SD semiconductor device") expressly excludes ICs, but includes devices such as light-emitting diodes (LEDs), diodes, transistors, resistors, and the like. Unless the context indicates otherwise, the term "semiconductor device die" or simply "die" refers to an unpackaged semiconductor device.

The ferromagnetic dies described herein may be manufactured from magnetic semiconductors. Magnetic semiconductors are semiconductor materials that exhibit both responsiveness to a magnetic fields (e.g., ferromagnetism) and useful semiconductor properties. Example magnetic semiconductors are made from one or more of the following: Manganese-doped indium arsenide and gallium arsenide (GaMnAs), Manganese-doped indium antimonide, manganese- and iron-doped indium oxide, manganese-doped zinc oxide, n-type cobalt-doped zinc oxide, cobalt-doped titanium dioxide (both rutile and anatase), chromium-doped rutile, iron-doped rutile and iron-doped anatase, nickel-doped anatase, manganese-doped tin dioxide, iron-doped tin dioxide, strontium-doped tin dioxide ($SrSnO_2$), europium oxide, and chromium doped aluminium nitride.

Like the paper used in a traditional electrophotographic deposition, the substrate described herein is made from material that is both thin and flexible. Examples of such material includes polyethylene terephthalate (PET), polyester, polyvinyl chloride (PVC), a polymide film (such as Kapton™), or the like.

In the above description of exemplary implementations, for purposes of explanation, specific numbers, materials configurations, and other details are set forth in order to better explain the present invention, as claimed. However, it will be apparent to one skilled in the art that the claimed invention may be practiced using different details than the exemplary ones described herein. In other instances, well-known features are omitted or simplified to clarify the description of the exemplary implementations.

The inventors intend the described exemplary implementations to be primarily examples. The inventors do not intend these exemplary implementations to limit the scope of the appended claims. Rather, the inventors have contemplated that the claimed invention might also be embodied and implemented in other ways, in conjunction with other present or future technologies.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

These processes are illustrated as a collection of blocks in a logical flow graph, which represents a sequence of operations that can be implemented in mechanics alone or a combination with hardware, software, and/or firmware. In the context of software/firmware, the blocks represent instructions stored on one or more computer-readable storage media that, when executed by one or more processors, perform the recited operations.

Note that the order in which the processes are described is not intended to be construed as a limitation, and any number of the described process blocks can be combined in any order to implement the processes or an alternate process. Additionally, individual blocks may be deleted from the processes without departing from the spirit and scope of the subject matter described herein.

Other Ways of Describing Implementations

Below is a listing of different ways to describe the implementations introduced here:

Example A

A method of electrophotographic deposition of unpackaged semiconductor devices ("dies"), the method comprising writing a latent image on a photosensitive drum, wherein the latent image includes a pre-configured outline of die placements that will be deposited onto a substrate, providing a developing unit filled with ferromagnetic dies, aligning the ferromagnetic dies in the developing unit to conform with the latent image on the photosensitive drum, wherein the aligning includes a controlled application of an electromagnetic (EM) polarization to affect a physical orientation of each ferromagnetic die configuring the photosensitive drum to include an electro-static charge, transferring the aligned ferromagnetic dies from the developing unit to the photosensitive drum, and depositing the ferromagnetic dies onto the substrate.

The subject matter of Example A can optionally include a ferromagnetic die that is a light-emitting diode (LED) die.

The subject matter of Example A can optionally include the pre-configured outline of die placements includes a defined number of uniformly shaped ferromagnetic dies that will be printed in a particular location or area of the substrate.

The subject matter of Example A can optionally include ferromagnetic dies which include magnetic semiconductor material.

The subject matter of Example A where the magnetic semiconductor material is formed partially or wholly on an outer perimeter of the die.

The subject matter of Example A, where the controlled application of the EM polarization exerts a corresponding pico-newton force onto the magnetic semiconductor material, wherein the exerted pico-newton force facilitates alignment of at least one of the ferromagnetic dies.

The subject matter of Example A, where the writing of the latent image on the photosensitive drum is facilitated by a light-emission subsystem, wherein an emission in light is modulated by an image representation of the pre-configured outline of unpackaged die placements.

The subject matter of Example A, where the physical orientation includes horizontal (X), vertical (Y), and angular positions.

The subject matter of Example A, where the transferring of the aligned ferromagnetic dies includes an individual transfer of aligned ferromagnetic die.

The subject matter of Example A can optionally include realigning of the transferred ferromagnetic dies in the photosensitive drum, wherein the realigning is based from an effect of friction and an air-gap in between the photosensitive drum and the developing unit.

Example B

A device comprising a light-emission subsystem configured to emit a light-emission pattern based upon a pre-configured outline of unpackaged semiconductor device ("die") placements that will be printed on a substrate, a photosensitive drum configured to receive the light-emission pattern that facilitates formation of a latent image on a photosensitive surface of the photosensitive drum, the latent image is an image representation of the pre-configured outline of die placements, a developing unit configured to receive and align ferromagnetic dies, wherein the aligned ferromagnetic dies are transferred by the developing unit to the photosensitive drum, and a transfer charger configured to facilitate deposition of the aligned ferromagnetic dies from the photosensitive drum to the substrate.

The device described in Example B can optionally include a light from the light-emission subsystem that is modulated by image data that is based from input code data from an external device.

The device described in Example B can optionally include a ferromagnetic die that is a light-emitting diode (LED) die.

The device as described in Example B can optionally incudea developing unit that aligns the ferromagnetic dies through a controlled application of an electromagnetic (EM) polarization that changes a physical orientation of each ferromagnetic die.

The device described in Example B can optionally include an EM potential supply configured to supply the EM polarization.

Example C

An apparatus comprising an external device configured to supply input code data, wherein the input code data is a specified circuitry layout design of unpackaged semiconductor device ("die") placements that will be printed on a substrate, a printer controller configured to receive and convert the input code data into image data, a light emission subsystem configured to emit a light-emission pattern based upon the image data, a photosensitive drum configured to receive the light-emission pattern that facilitates formation of a latent image on a photosensitive surface of the photosensitive drum, the latent image is an image representation of the image data, a developing unit configured to receive and align ferromagnetic dies, wherein the aligned ferromagnetic dies are transferred by the developing unit to the photosensitive drum, and a transfer charger configured to facilitate deposition of the aligned ferromagnetic dies from the photosensitive drum to the substrate.

The apparatus described in Example C can optionally include a ferromagnetic die which is a light-emitting diode (LED) die.

The apparatus described in Example C can optionally include a developing unit which aligns the ferromagnetic dies through a controlled application of an electromagnetic (EM) polarization that changes a physical orientation of each ferromagnetic die.

The apparatus described in Example C can optionally include an EM potential supply configured to supply the EM polarization.

The apparatus described in Example C can optionally include a charging unit configured to supply uniform electrostatic charges to the photosensitive drum to hold the transferred aligned ferromagnetic dies from the developing unit.

What is claimed is:

1. A method of electrophotographic deposition of unpackaged semiconductor devices ("dies"), the method comprising:
    writing a latent image on a photosensitive drum, wherein the latent image includes a pre-configured outline of die placements that will be deposited onto a substrate;
    providing a developing unit filled with ferromagnetic dies;
    aligning the ferromagnetic dies in the developing unit to conform with the latent image on the photosensitive drum, wherein the aligning includes a controlled application of an electro-magnetic (EM) polarization to affect a physical orientation of each ferromagnetic die;
    configuring the photosensitive drum to include an electrostatic charge;
    transferring the aligned ferromagnetic dies from the developing unit to the photosensitive drum;
    depositing the ferromagnetic dies onto the substrate.

2. The method as recited in claim 1, wherein the ferromagnetic die is a light-emitting diode (LED) die.

3. The method as recited in claim 1, wherein the pre-configured outline of die placements includes a defined number of uniformly shaped ferromagnetic dies that will be printed in a particular location or area of the substrate.

4. The method as recited in claim 1, wherein the ferromagnetic dies include magnetic semiconductor material.

5. The method as recited in claim 4, wherein the magnetic semiconductor material is formed partially or wholly on an outer perimeter of the die.

6. The method as recited in claim 5, wherein the controlled application of the EM polarization exerts a corresponding pico-newton force onto the magnetic semiconductor material, wherein the exerted pico-newton force facilitates alignment of at least one of the ferromagnetic dies.

7. The method as recited in claim 1, wherein the writing of the latent image on the photosensitive drum is facilitated by a light-emission subsystem, wherein an emission in light is modulated by an image representation of the pre-configured outline of unpackaged die placements.

8. The method as recited in claim 1, wherein the physical orientation includes horizontal (X), vertical (Y), and angular positions.

9. The method as recited in claim 1, wherein the transferring of the aligned ferromagnetic dies includes an individual transfer of aligned ferromagnetic die.

10. The method as recited in claim 1 further comprising: realigning of the transferred ferromagnetic dies in the photosensitive drum, wherein the realigning is based from an effect of friction and an air-gap in between the photosensitive drum and the developing unit.

11. A device comprising:
    a light-emission subsystem configured to emit a light-emission pattern based upon a pre-configured outline of unpackaged semiconductor device ("die") placements that will be printed on a substrate;
    a photosensitive drum configured to receive the light-emission pattern that facilitates formation of a latent image on a photosensitive surface of the photosensitive drum, the latent image is an image representation of the pre-configured outline of die placements;
    a developing unit configured to receive and align ferromagnetic dies, wherein the aligned ferromagnetic dies are transferred by the developing unit to the photosensitive drum;
    a transfer charger configured to facilitate deposition of the aligned ferromagnetic dies from the photosensitive drum to the substrate.

12. The device as recited in claim 11, wherein the light from the light-emission subsystem is modulated by image data that is based from input code data from an external device.

13. The device as recited in claim 11, wherein the ferromagnetic die is a light-emitting diode (LED) die.

14. The device as recited in claim 11, wherein developing unit aligns the ferromagnetic dies through a controlled application of an electromagnetic (EM) polarization that changes a physical orientation of each ferromagnetic die.

15. The device as recited in claim 14 further comprising an EM potential supply configured to supply the EM polarization.

16. An apparatus comprising:
    an external device configured to supply input code data, wherein the input code data is a specified circuitry layout design of unpackaged semiconductor device ("die") placements that will be printed on a substrate;
    a printer controller configured to receive and convert the input code data into image data;

a light emission subsystem configured to emit a light-emission pattern based upon the image data;

a photosensitive drum configured to receive the light-emission pattern that facilitates formation of a latent image on a photosensitive surface of the photosensitive drum, the latent image is an image representation of the image data;

a developing unit configured to receive and align ferromagnetic dies, wherein the aligned ferromagnetic dies are transferred by the developing unit to the photosensitive drum;

a transfer charger configured to facilitate deposition of the aligned ferromagnetic dies from the photosensitive drum to the substrate.

17. The apparatus as recited in claim 16, wherein the ferromagnetic die is a light-emitting diode (LED) die.

18. The apparatus as recited in claim 16, wherein developing unit aligns the ferromagnetic dies through a controlled application of an electromagnetic (EM) polarization that changes a physical orientation of each ferromagnetic die.

19. The apparatus as recited in claim 18 further comprising an EM potential supply configured to supply the EM polarization.

20. The apparatus as recited in claim 18 further comprising a charging unit configured to supply uniform electrostatic charges to the photosensitive drum to hold the transferred aligned ferromagnetic dies from the developing unit.

* * * * *